(12) United States Patent
Son

(10) Patent No.: US 7,567,029 B2
(45) Date of Patent: Jul. 28, 2009

(54) ORGANIC ELECTRO-LUMINESCENCE DISPLAY DEVICE AND FABRICATING METHOD THEREOF

(75) Inventor: Woo Hyun Son, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 80 days.

(21) Appl. No.: 11/258,127

(22) Filed: Oct. 26, 2005

(65) Prior Publication Data

US 2006/0097629 A1 May 11, 2006

(30) Foreign Application Priority Data

Nov. 11, 2004  (KR) .................... 10-2004-0092140

(51) Int. Cl.
*H01J 1/62* (2006.01)
*H01J 63/04* (2006.01)
*H01L 33/00* (2006.01)
*H01L 29/24* (2006.01)

(52) U.S. Cl. .................. 313/504; 313/507; 313/506; 445/24

(58) Field of Classification Search ......... 313/502–507; 257/98, 40; 445/24–25; 303/501–507
See application file for complete search history.

(56) References Cited

U.S. PATENT DOCUMENTS

| 5,844,363 | A | * | 12/1998 | Gu et al. ............... 313/506 |
| 6,602,540 | B2 | * | 8/2003 | Gu et al. ............... 427/66 |
| 2001/0033135 | A1 | | 10/2001 | Duggal et al. |
| 2002/0101152 | A1 | * | 8/2002 | Kimura ................ 313/505 |
| 2003/0062520 | A1 | | 4/2003 | Toguchi et al. |
| 2003/0107314 | A1 | | 6/2003 | Urabe et al. |
| 2003/0201716 | A1 | * | 10/2003 | Yamazaki et al. ......... 313/506 |
| 2003/0227255 | A1 | * | 12/2003 | Auch et al. ............ 313/506 |
| 2004/0012328 | A1 | * | 1/2004 | Arnold et al. .......... 313/504 |
| 2004/0012980 | A1 | * | 1/2004 | Sugiura et al. ......... 362/560 |
| 2004/0017152 | A1 | * | 1/2004 | Hashimoto et al. ...... 313/505 |
| 2004/0211971 | A1 | * | 10/2004 | Takei et al. ............. 257/98 |
| 2005/0088084 | A1 | * | 4/2005 | Cok ..................... 313/506 |

FOREIGN PATENT DOCUMENTS

CN  1545824 A  11/2004

* cited by examiner

*Primary Examiner*—Sikha Roy
*Assistant Examiner*—Tracie Y Green
(74) *Attorney, Agent, or Firm*—Birch, Stewart, Kolasch & Birch, LLP

(57) ABSTRACT

There are disclosed an organic electro luminescence display device that is adaptive for improving its contrast ratio, and a fabricating method thereof.

An organic electro luminescence display device according to an embodiment of the present invention includes an anode electrode formed on a substrate; and a concavo-convex area formed on the substrate in an area except for an area where the anode electrode is formed.

9 Claims, 12 Drawing Sheets

ORGANIC ELECTRO-LUMINESCENCE DISPLAY DEVICE AND FABRICATING METHOD THEREOF

This application claims the benefit of the Korean Patent Application No. P2004-92140 filed on Nov. 11, 2004, which is hereby incorporated by reference.

BACKGROUND OF THE INVENTION

1. Field of the Invention

The present invention relates to an organic electro luminescence display device, and more particularly to an organic electro luminescence display device that is adaptive for improving its contrast ratio, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device.

Especially, the EL display device basically has a shape of sticking an electrode to both side surfaces of an organic light emitting layer which is made up of a hole transport layer, a light emitting layer and an electron transport layer, and the EL display device attracts attention as a next generation flat panel display because of its wide viewing angle, high aperture ratio, high color sense and so on.

The EL display device is largely divided into an inorganic EL display device and an organic EL display device in accordance with a material used. The organic EL display device among these has an advantage of being driven with lower voltage than an inorganic EL display device because electrons and holes form pairs and then they become extinct to emit light when electric charges are injected into an organic EL layer which is formed between a hole injection electrode and an electron injection electrode. Further, the organic EL display device can form elements even on a transparent substrate which is flexible like plastics, and the organic EL display device can be driven at a low voltage of below 10V, has relatively low power consumption and has excellent color sense in comparison with the PDP or the inorganic EL display device.

FIG. 1 is a perspective view representing a related art organic EL display device, and FIG. 2 is a diagram representing the organic EL display device shown in FIG. 1, taken along the line I-I'.

The organic EL display device shown in FIG. 1 has a first electrode (or an anode electrode) 4 and a second electrode (or a cathode electrode) 12 formed on a substrate 2 in a direction of crossing each other.

A plurality of anode electrodes 4 are formed on the substrate 2 to be separated from each other with a designated gap. An insulating film 6 having an aperture part for each EL cell area is formed on the substrate 2 where the anode electrode 4 is formed. Barrier ribs 8 are located on the insulating film 6 for separating an organic light emitting layer 10 and the cathode electrode 12 which are to be formed thereon. The barrier ribs 8 are formed in a direction of crossing the anode electrode 4 and have a reverse taper structure where an upper end part has a wider width than a lower end part. The organic light emitting layer 10 and the cathode electrode 12 formed of an organic compound are sequentially deposited over the entire surface of the insulating film 6 where the barrier ribs 8 are formed. The organic light emitting layer 10 has a hole transport layer, a light emitting layer and an electron transport layer deposited and formed on the insulating film. The organic EL display device has electrons and holes emitted if a driving signal is applied to the anode electrode 4 and the cathode electrode 12, and the electrons and holes emitted from the anode electrode 4 and the cathode electrode 12 are recombined within the organic light emitting layer 10 to generate a visible ray. At this moment, the generated visible ray exits to the outside through the anode electrode 4 to display a designated picture or image.

On the other hand, in the related art organic EL display device, the light incident from the outside almost completely transmits the anode electrode 4, the barrier rib 8 and the organic light emitting layer 10. As a result, when the light is not emitted from the organic light emitting layer 10, as shown in FIG. 3, an external light 40 being incident from the surface of the substrate 2 transmits the organic light emitting layer 10 and the anode electrode 4 of a transparent conductive material, and is reflected by the cathode electrode 12 of metal electrode to exit to the outside of the device. Accordingly, there is a problem in that its contrast ratio is deteriorated.

SUMMARY OF THE INVENTION

Accordingly, it is an object of the present invention to provide an organic electro luminescence display device that is adaptive for improving its contrast ratio by intercepting an external light, and a fabricating method thereof.

In order to achieve these and other objects of the invention, an organic electro luminescence display device according to an aspect of the present invention includes an anode electrode formed on a substrate; and a concavo-convex area formed on the substrate in an area except for an area where the anode electrode is formed.

In the organic electro luminescence display device further includes an insulating film which partially exposes the anode electrode to define a light emitting area; an organic light emitting layer formed on the light emitting area; and a cathode electrode which crosses the anode electrode with the organic light emitting layer therebetween, and wherein the concavo-convex area intercepts a progress path of an external light which is incident to the anode electrode and reflected in the cathode electrode.

A fabricating method of an organic electro luminescence display device according to another aspect of the present invention includes the steps of forming a concavo-convex area in an area except for an area where an anode electrode is formed on a substrate; forming the anode electrode in an area except for the concavo-convex area; forming an insulating film which partially exposes the anode electrode to define a light emitting area; forming an organic light emitting layer on the light emitting area; and forming a cathode electrode which crosses the anode electrode with the organic light emitting layer therebetween.

In the fabricating method, the concavo-convex area which is formed on the substrate is formed by use of at least any one of a laser, a photolithography process and a sand blast process.

In the fabricating method, the concavo-convex area intercepts an external light.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

With reference to FIGS. 4 to 7F, embodiments of the present invention will be explained as follows.

Figure 1:
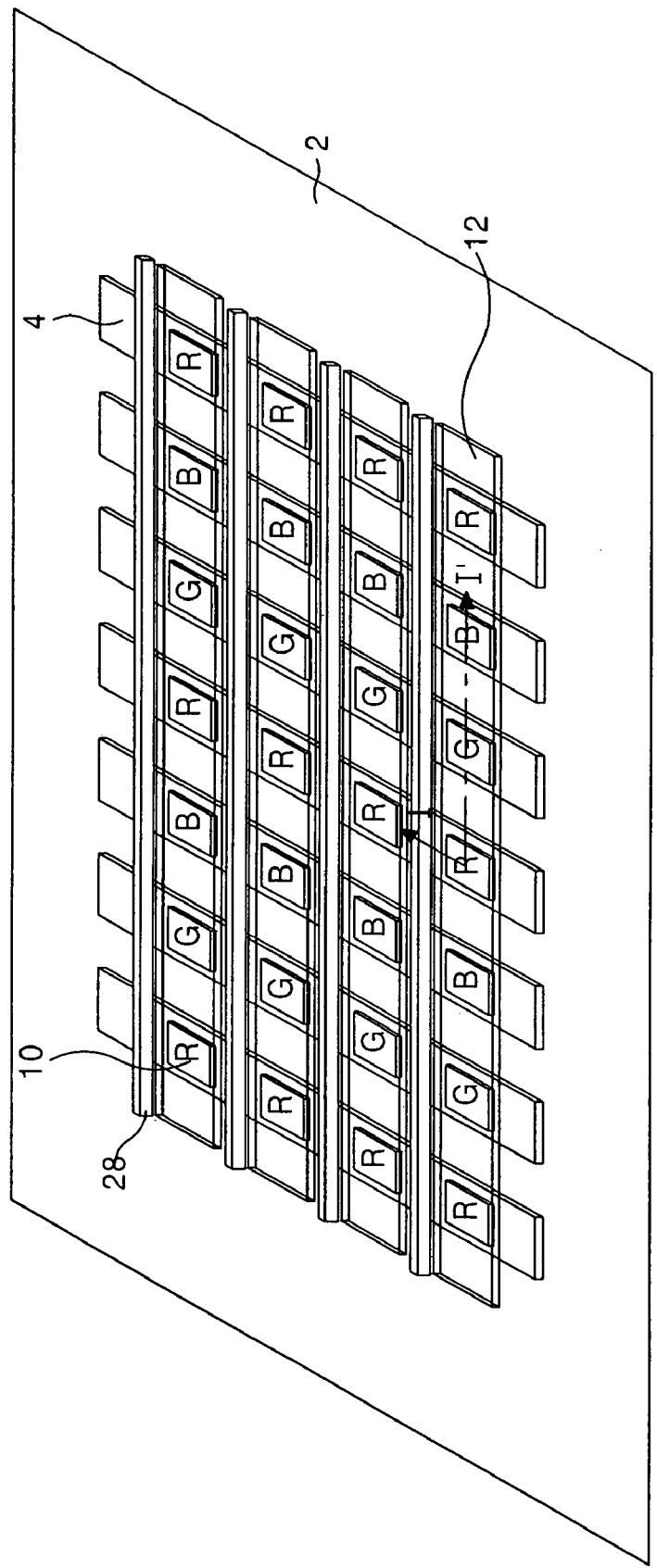
FIG. 1 a perspective view briefly illustrating a related art organic electro luminescence display device.
Figure 2:
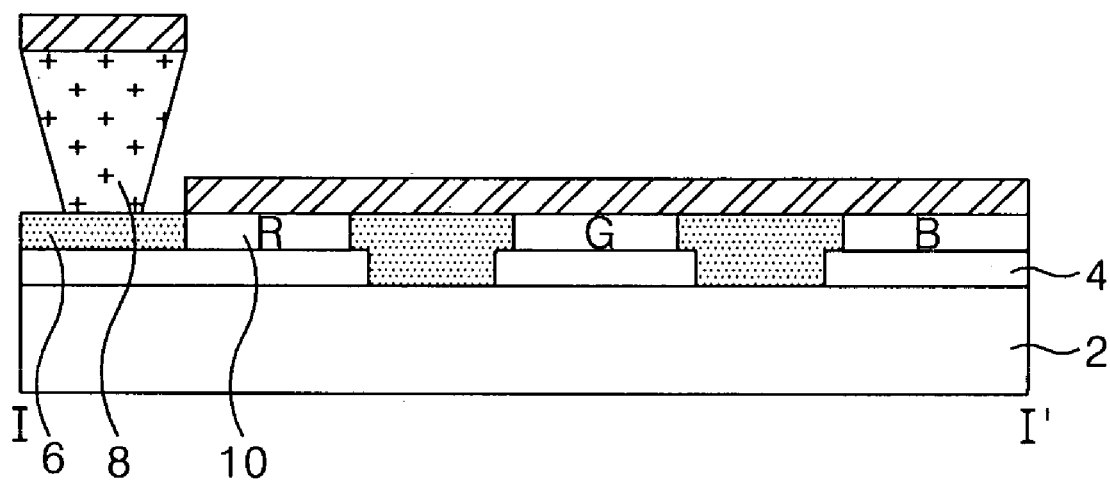
FIG. 2 is a sectional diagram representing the organic electro luminescence display device shown in FIG. 1, taken along the line I-I'.
Figure 3:
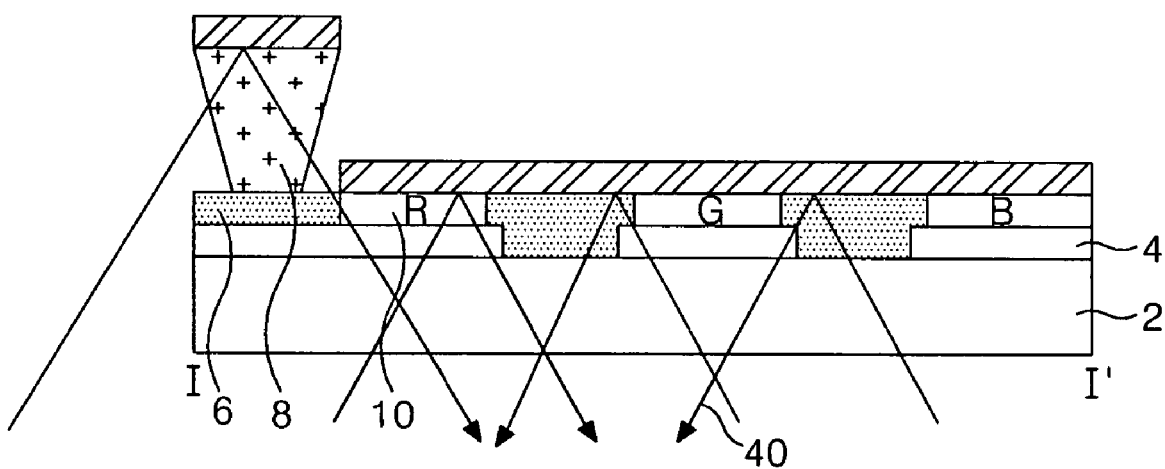
FIG. 3 is a diagram representing that an incident external light is reflected in a cathode electrode of an organic electro luminescence display device.
Figure 4:
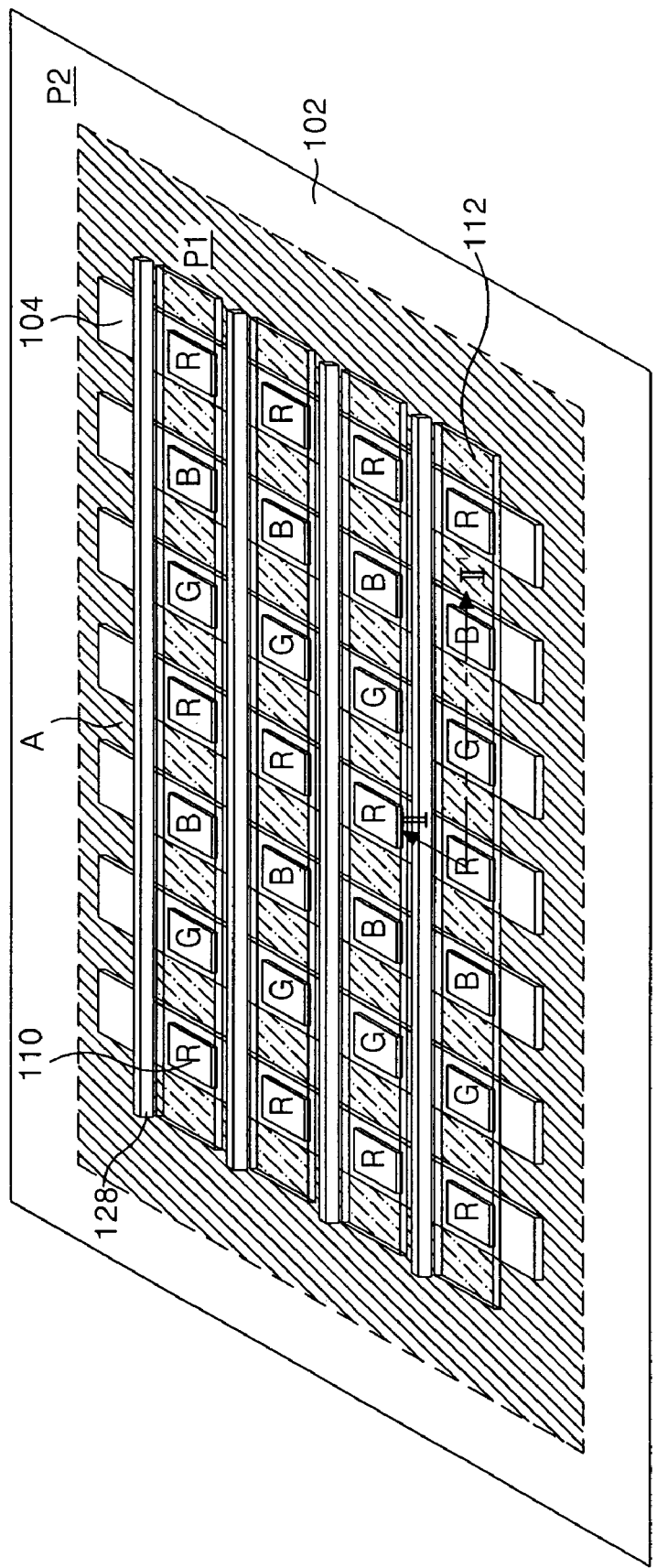
FIG. 4 is a perspective view representing an organic electro luminescence display device according to an embodiment of the present invention.
Figure 5:
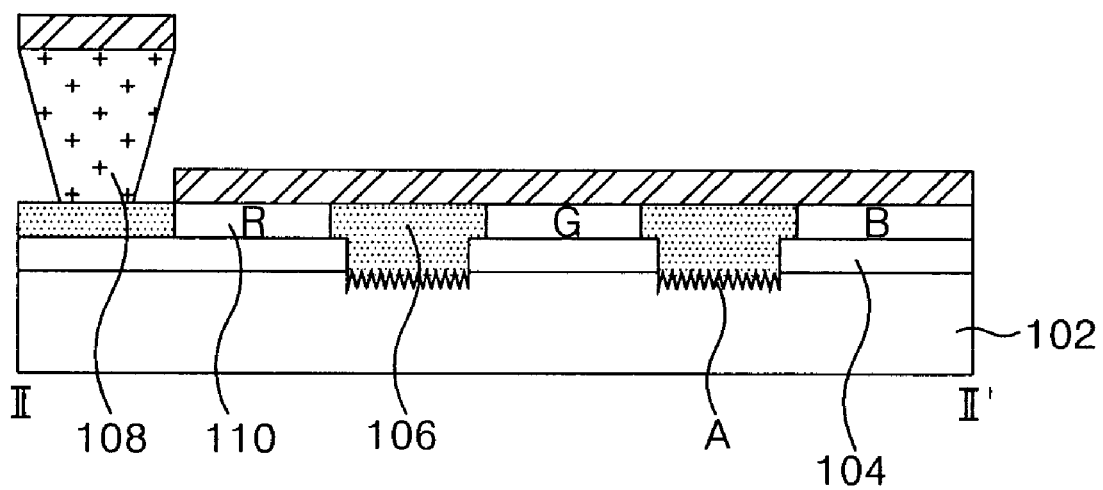
FIG. 5 is a sectional diagram representing the organic electro luminescence display device shown in FIG. 4, taken along the line II-II'.

FIG. 4 is a perspective view representing an organic EL display device according to an embodiment of the present invention, and FIG. 5 is a sectional diagram illustrating the organic EL display device, taken along the line II-II' shown in FIG. 4.

An organic EL display device shown in FIGS. 4 and 5 has a first electrode (or an anode electrode) 104 and a second electrode (or a cathode electrode) 112 formed on a display area P1 of a substrate 102 in a direction of crossing each other, and includes a concavo-convex area (A) formed in an area except for an area where the first electrode 104 is located in the display area P1 of the substrate 102.

A plurality of anode electrodes 104 are formed on the substrate 102 to be separated from each other with a designated gap. An insulating film 106 having an aperture part for each EL cell area is formed on the substrate 102 where the anode electrode 104 is formed. Barrier ribs 108 are located on the insulating film 106 for separating an organic light emitting layer 110 and the cathode electrode 112 which are to be formed thereon. The barrier ribs 108 are formed in a direction of crossing the anode electrode 104 and have a reverse taper structure where an upper end part has a wider width than a lower end part. The organic light emitting layer 110 and the cathode electrode 112 formed of an organic compound are sequentially deposited over the entire surface of the insulating film 106 where the barrier ribs 108 are formed. The organic light emitting layer 110 has a hole transport layer, a light emitting layer and an electron transport layer deposited and formed on the insulating film 106.

The concavo-convex area (A) plays the role of shielding or absorbing an external light. That is, the concavo-convex area (A) is a uneven area which is damaged by irradiating a laser to the substrate 102 or formed by use of a photo resist process and an etching process, so that the concavo-convex area (A) plays the role of shielding the external light.

Figure 6:
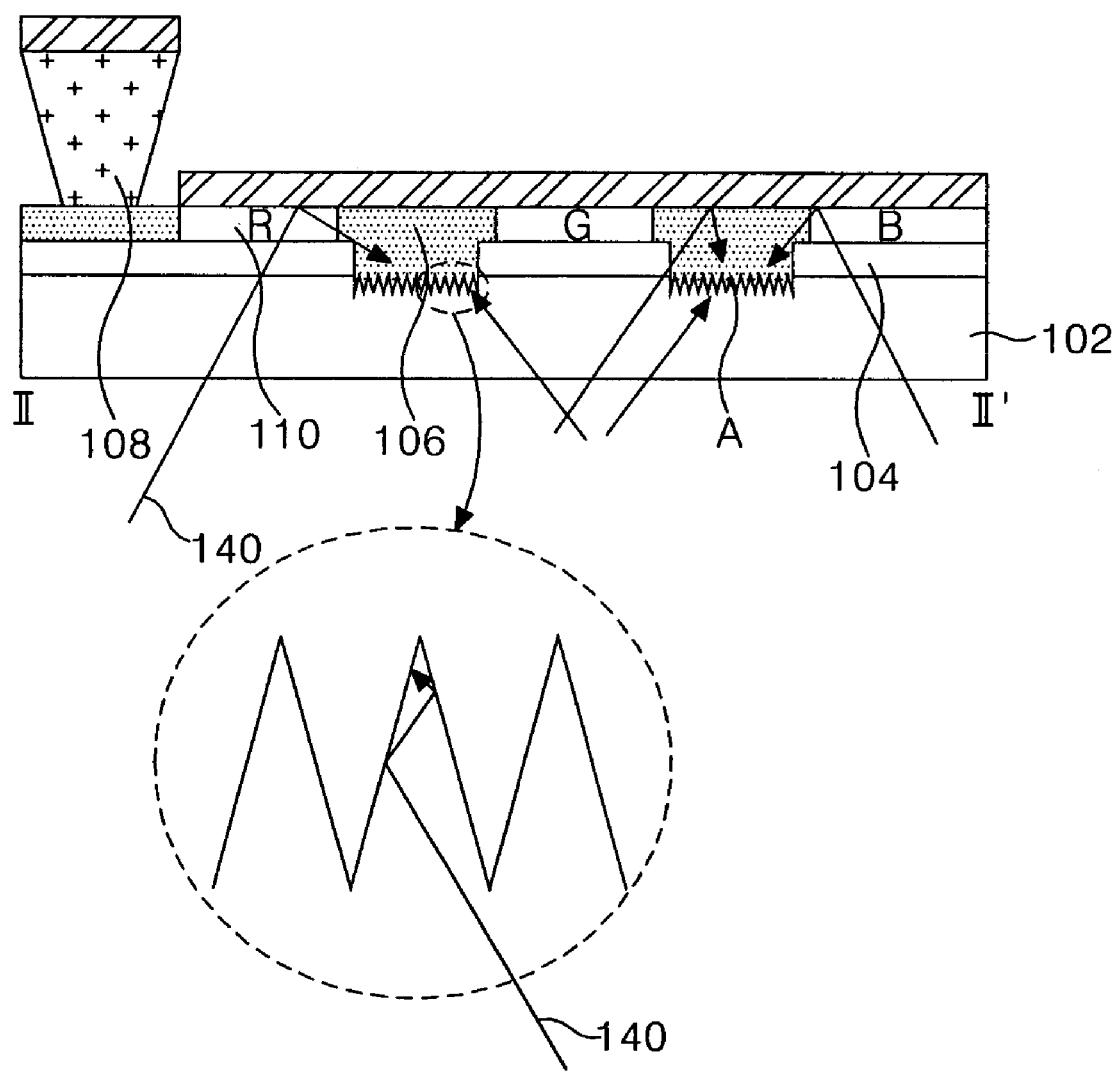
FIG. 6 is a diagram representing a light shielding role of a concavo-convex area shown in FIG. 5.

In other words, the external light 140 being incident to the substrate 102, as shown in FIG. 6, becomes extinct by a plurality of reflection within the concavo-convex area (A), and the external light 140 being incident through an area except for the concavo-convex area (A) is reflected by the cathode electrode 112, and then the external light 140 almost cannot exit to the outside and becomes extinct by the concavo-convex area (A). In this way, the concavo-convex area (A) intercepts a progress path of the external light, thereby enabling to improve its contrast ratio.

In this way, in the organic EL display device according to the present invention, the concavo-convex area (A) is formed in an area except for the anode electrode 104 on the display area P1. The concavo-convex area (A) intercepts a considerable amount of the external light which is incident to the inside of the device from the outside, and plays the role of also intercepting the external light which is partially transmitted and reflected in the cathode electrode 112. Accordingly, the contrast ratio is improved.

Hereinafter, in reference to FIGS. 7A to 7F, a fabricating method of the related art organic EL display device is described as follows.

Figure 7A:
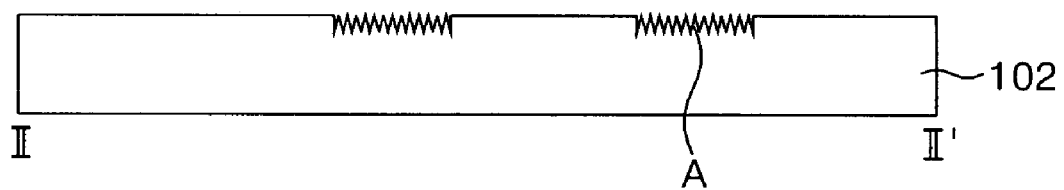
FIGS. 7A to 7F are diagrams representing a fabricating method of a related art organic electro luminescence display device.

Firstly, after providing a substrate 102 which is formed by use of sodalime or hard glass, a laser is irradiated to an area except for an area where the anode electrode 104 is to be formed in the display area P1 of the substrate 102 so as to give damage to the surface of the substrate 102, or a photolithography process and an etching process are performed, thereby forming the concavo-convex area (A) on the substrate 102, as shown in FIG. 7A. On the other hand, the concavo-convex area (A) can be formed by use of a sand blast method using a dry film resist DFR instead of the photolithography process and the dry etching process.

Figure 7B:
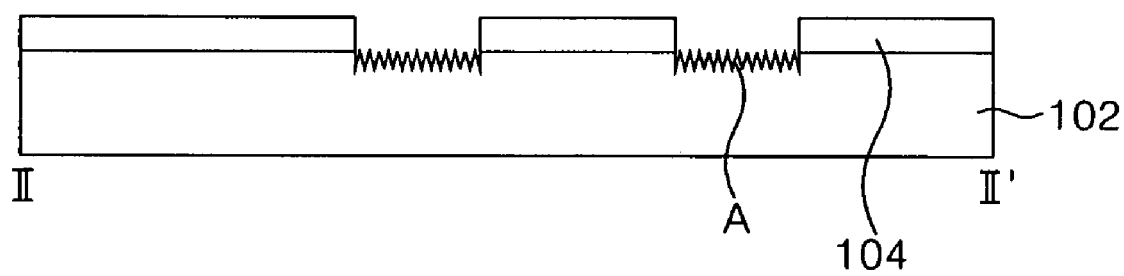

After depositing a transparent conductive metal material on the substrate 102 where the concavo-convex area (A) is formed, the transparent conductive metal material is patterned by the photolithography process and the etching process, thereby forming the anode electrode 104, as shown in FIG. 7B. Herein, the metal material is indium tin oxide or SnO2.

Figure 7C:
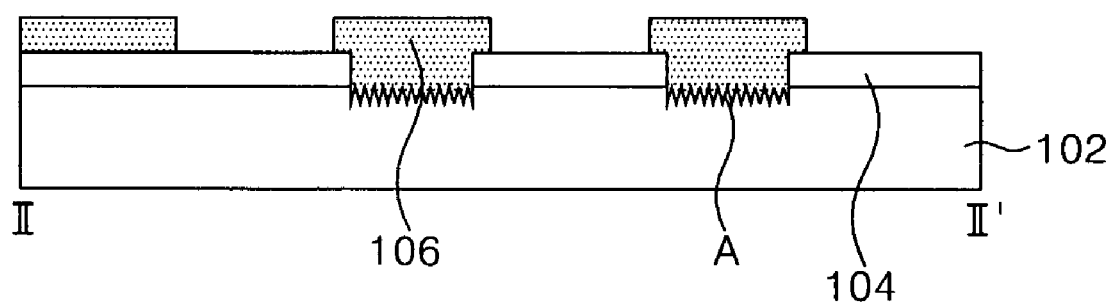

After forming a photo sensitive insulating material on the substrate 102 where the anode electrode 104 is formed, the photo sensitive insulating material is patterned by the photolithography process, thereby partially exposing the anode electrode 104 to form the insulating film 106 which defines a light emitting area, as shown in FIG. 7C.

Figure 7D:
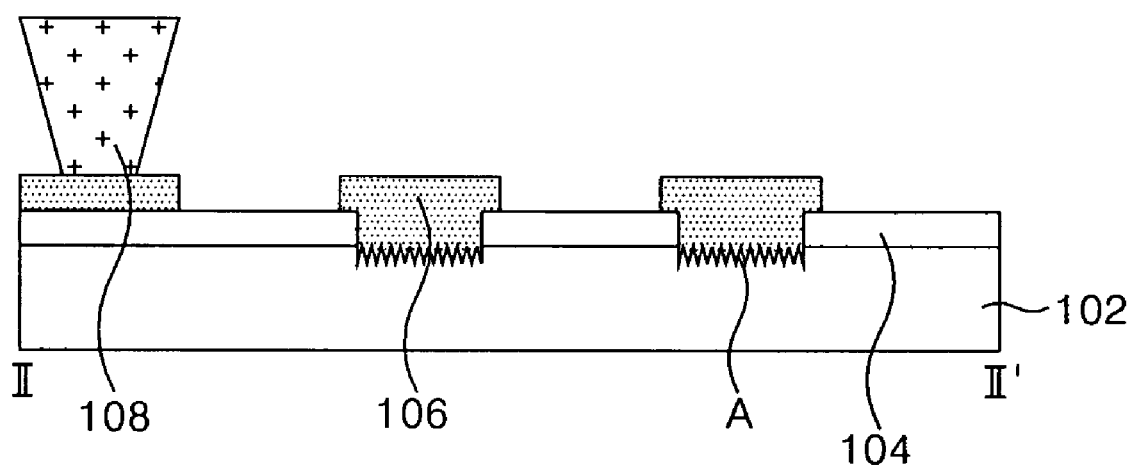

After a photo sensitive organic material is deposited on the substrate 102 where the insulating film 106 is formed, the photo sensitive organic material is patterned by the photolithography process, thereby forming the barrier rib 108, as shown in FIG. 7D. The barrier rib 108 is formed in a non light emitting area to cross a plurality of anode electrodes 104 for dividing pixels.

Figure 7E:
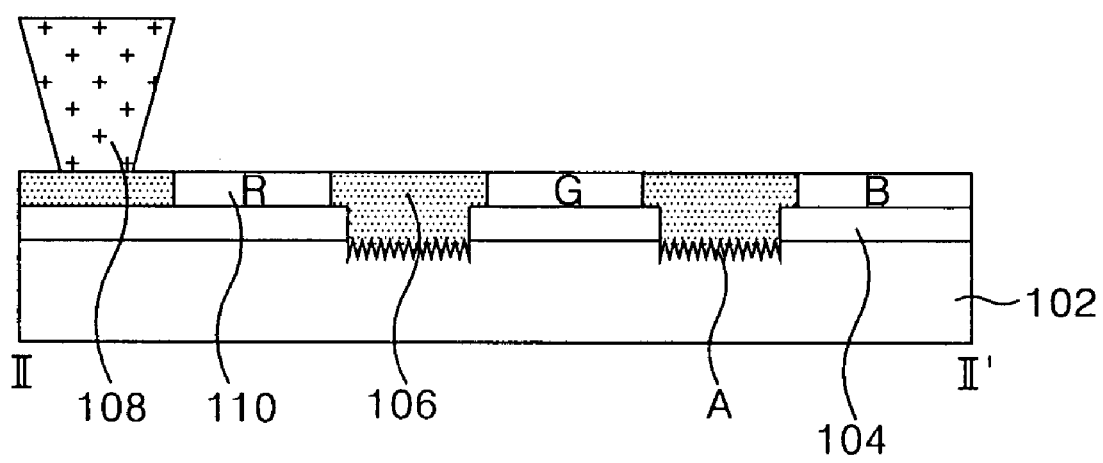

An organic material is deposited on the substrate 102 where the barrier rib 108 is formed by use of a thermal deposition method and a vacuum deposition method, thereby forming the organic Light emitting layer 110, as shown in FIG. 7E.

Figure 7F:
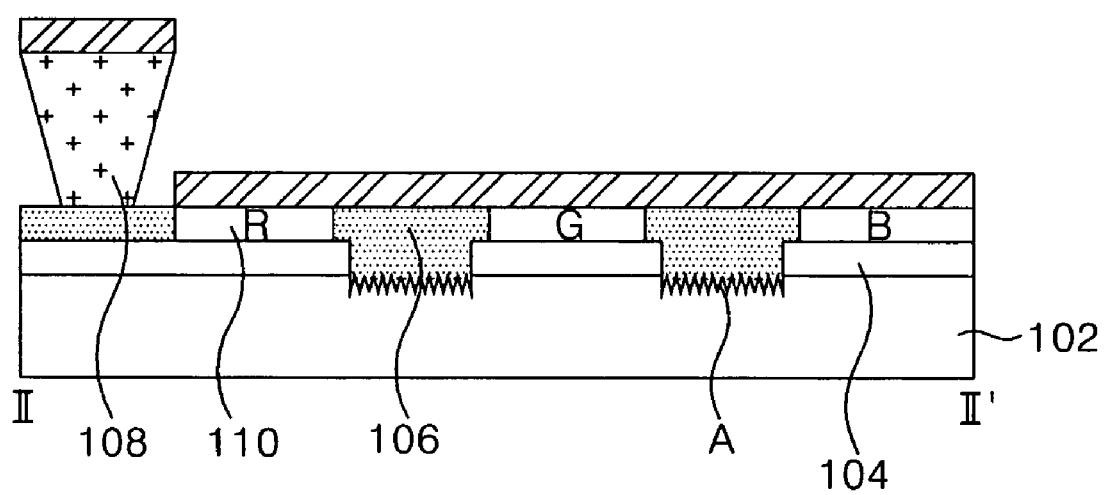

A metal material is deposited on the substrate 102 where the organic light emitting layer 110 is formed, thereby forming the cathode electrode 112, as shown in FIG. 7F.

As described above, the organic EL display device and the fabricating method thereof according to the present invention has the concavo-convex area formed in the area except for the anode electrode on the display area. The concavo-convex area intercepts a considerable amount of the external light which is incident to the inside of the device from the outside, and plays the role of also intercepting the external light which is partially transmitted and reflected in the cathode electrode. Accordingly, the contrast ratio is improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device, comprising:
    anode electrodes formed on a substrate;
    an insulating film formed on the substrate, the insulating film partially exposing the anode electrodes to define light emitting areas;
    organic light emitting layers formed on the light emitting areas; and
    a plurality of concavo-convex areas formed on the substrate in areas except for areas where the anode electrodes are formed,
    wherein each of the concavo-convex areas is formed between the light emitting areas and comprises a plurality of prominences, and the insulating layer for defining the light emitting areas is in contact with a surface of the prominences.

2. The organic electro luminescence display device according to claim 1, further comprising:
    cathode electrodes which cross the anode electrodes with the organic light emitting layers therebetween,
    wherein each of the concavo-convex areas intercepts a progress path of an external light which is incident to the anode electrodes and reflected in the cathode electrodes.

3. A fabricating method of an organic electro luminescence display device, comprising:
    forming a plurality of concavo-convex areas in areas except for areas where anode electrodes are formed on a substrate;
    forming the anode electrodes in areas except for the concavo-convex areas;
    forming an insulating film on the substrate, the insulating film partially exposing the anode electrodes to define light emitting areas;
    forming organic light emitting layers on the light emitting area; and
    forming cathode electrodes which cross the anode electrodes with the organic light emitting layers therebetween,
    wherein each of the concavo-convex areas is formed between the light emitting areas and comprises a plurality of prominences, and the insulating layer for defining the light emitting areas is in contact with a surface of the prominences.

4. The fabricating method according to claim 3, wherein each of the concavo-convex areas which is formed on the substrate is formed by use of at least any one of a laser, a photolithogaphy process and a sand blast process.

5. The fabricating method according to claim 3, wherein each of the concavo-convex areas intercepts an external light.

6. An organic electro luminescence display device, comprising:
    a substrate;
    a plurality of anode electrodes formed on the substrate to be separated from each other with a designated gap between adjacent anode electrodes in a light emitting area;
    a plurality of concavo-convex areas formed directly on the substrate in areas of the designated gap between adjacent electrodes in the light emitting area;
    an insulating film disposed over the concavo-convex areas; and
    an organic light emitting layer formed on the adjacent anode electrodes in the light emitting area,
    wherein each of the concavo-convex areas is formed between the light emitting areas and comprises a plurality of prominences, and the insulating layer for defining the light emitting areas is in contact with a surface of the prominences.

7. The organic electro luminescence display device according to claim 6, further comprising:
    cathode electrodes which cross the anode electrodes with the organic light emitting layer therebetween,
    wherein each of the concavo-convex areas intercepts a progress path of an external light which is incident to the anode electrodes and reflected in the cathode electrodes.

8. A method of fabricating an organic electro luminescence display device, the method comprising:
    forming a plurality of anode electrodes on the substrate to be separated from each other with a designated gap between adjacent anode electrodes in a light emitting area;
    forming a plurality of concavo-convex areas directly on the substrate in areas of the designated gap between adjacent electrodes in the light emitting area;
    forming an insulating film over the concavo-convex areas; and
    forming an organic light emitting layer on the adjacent anode electrodes in the light emitting area,
    wherein each of the concavo-convex areas is formed between the light emitting areas and comprises a plurality of prominences, and the insulating layer for defining the light emitting areas is in contact with a surface of the prominences.

9. The fabricating method according to claim 8, further comprising:
    forming cathode electrodes which cross the anode electrodes with the organic light emitting layer therebetween,
    wherein each of the concave-convex areas intercepts a progress path of an external light which is incident to the anode electrodes and reflected in the cathode electrodes.

* * * * *